United States Patent [19]

Fesenko et al.

[11] 4,313,839
[45] Feb. 2, 1982

[54] PIEZOCERAMIC MATERIAL

[76] Inventors: Evgeny G. Fesenko, Dolomanovsky pereulok, 2, kv. 2; Alla Y. Dantsiger, ulitsa V. Nolnaya, 14/90, kv. 91; Viktor S. Filipiev, ulitsa Engelsa, 34, kv. 35; Olga N. Razumovskaya, ulitsa Lenina, 70, kv. 25; Alexandr N. Klevtsov, prospekt Stachki, 223/3, kv. 20; Vladimir N. Lebedev, 1 Pereulok, 41; Ljudmila D. Grineva, ulitsa Gerasimenco 12, kv. 8; Tatyana V. Rogach, ulitsa Arefieva, 43; Anatoly D. Feronov, ulitsa Mechnicova, 36, kv. 9; Galina M. Akbaeva, ulitsa Kazakhskaya, 88, kv. 34; Evgeny I. Cheptsov, ulitsa Zhuravleva, 111, kv. 1; Anatoly E. Panich, ulitsa Suvorova, 40, kv. 21; Ljudmila G. Lisitsina, Budenovsky pereulok, 4, kv. 53; Svetlana A. Lavrikova, 2 Krasnodarskaya ulitsa, 163/12, kv. 1, all of Rostov-na-Donu; Vasily A. Ochirov, Mikroraion 1, 28, kv. 24, Elista, Kalmytskaya ASSR; Svetlana I. Dudkina, ulitsa Sedova, 105, kv. 4, Rostov-na-Donu; Alexandr N. Nevsky, ulitsa Sokolova, 6, kv. 11, Rostov-na-Donu; Vladimir A. Aleshin, ulitsa Gerasimenko, 13a, kv. 20, Rostov-na-Donu; Mikhail F. Kupriyanov, ulitsa Stachki, 217/3, kv. 62, Rostov-na-Donu; Evgeny S. Baljunis, 2 Krasnodarskaya ulitsa, 163/3, kv. 20, Rostov-na-Donu; Boris P. Mordanov, ulitsa Stanislavskogo, 170, kv. 7, Rostov-na-Donu; Grigory A. Zhitomirsky, Khalturinsky pereulok, 56, kv. 6, Rostov-na-Donu; Naum B. Feldman, ulitsa 11 Parkovaya, 44, korpus 4, kv. 25, Moscow; Ekaterina G. Smazhevskaya, ulitsa Parkovaya, 42, korpus 2, kv. 56, Moscow; Ravilya U. Devlikanova, ulitsa Metailurgicheskaya, 91, Rostov-na-Donu, all of U.S.S.R.

[21] Appl. No.: 764,643
[22] Filed: Feb. 1, 1977

Related U.S. Application Data

[63] Continuation of Ser. No. 653,886, Jan. 30, 1976, abandoned, which is a continuation of Ser. No. 341,953, Mar. 16, 1973, abandoned.

[51] Int. Cl.$^3$ .............................................. C04B 35/49
[52] U.S. Cl. ................................................... 252/62.9
[58] Field of Search ....................................... 252/62.9

[56] References Cited

U.S. PATENT DOCUMENTS 3,463,732  8/1969  Banno et al. ...................... 252/62.9
3,594,321  7/1971  Ohno et al. ........................ 252/62.9

FOREIGN PATENT DOCUMENTS 45-16869  6/1970  Japan .................................. 252/62.9
45-27625  9/1970  Japan .................................. 252/62.9
45-30151  9/1970  Japan .................................. 252/62.9
47-9183   3/1972  Japan .................................. 252/62.9

Primary Examiner—Jack Cooper
Attorney, Agent, or Firm—Holman & Stern

[57] ABSTRACT

A piezoceramic material comprising $PbTiO_3$, $PbZrO_3$, $PbB'_{1-\alpha}B''_\alpha O_3$, and $PbB'''_{1-\alpha}Ba^{IV}O_3$, wherein B' is selected from the group consisting of $Nb^{5+}$, $W^{6+}$; B'' is selected from the group consisting of $Zn^{2+}$, $Mg^{2+}$, $Co^{2+}$, $Mn^{2+}$, $Ni^{2+}$; B''' is selected from the group consisting of $Nb^{5+}$, $W^{6+}$; $B^{IV}$ is selected from the group consisting of $Zn^{2+}$, $Mg^{2+}$, $Co^{2+}$, $Ni^{2+}$; $\alpha = \frac{1}{2}$ for $W^{6+}$ and $\frac{1}{3}$ for $Nb^{5+}$, with B' and B''' being equal to $Nb^{5+}$, and B'' being equal to $Ni^{2+}$, $B^{IV}$ is neither equal to $Zn^{2+}$ nor to $Mn^{2+}$; with B' and B''' being equal to $Nb^{5+}$, B'' being equal to $Mg^{2+}$, $B^{IV}$ is not equal to $Mn^{2+}$, and the content of the above components being as follows, molar percent:

| $PbTiO_3$ | 30.0 to 52.5 | $PbB_{1-\alpha'}B_{\alpha}''O_3$ | 1.5 to 28.4 |
|---|---|---|---|
| $PbZrO_3$ | 25.0 to 47.6 | $PbB_{1-\alpha}'''B_\alpha^{IV}O_3$ | 2.3 to 29.4 |

5 Claims, No Drawings

PIEZOCERAMIC MATERIAL

This is a continuation of application Ser. No. 653,886, filed Jan. 30, 1976 which in turn is a Rule 60 continuation of U.S. Ser. No. 341,953, filed Mar. 16, 1973, both now abandoned.

BACKGROUND OF THE INVENTION

The present invention relates to materials useful in electronics and, more specifically, to piezoceramic materials.

The materials are used in acoustics, hydroacoustics, ultrasonic delay lines, and filter technology.

It is known that the highest piezoactivity is revealed by compositions pertaining to morphotropic regions of binary and ternary systems of solid solutions. As the number of components in a system increases, the dimension of the morphotropic region is increased and the range of compositions having parameters of extreme values is broadened.

In the prior art piezoceramic materials comprising ternary systems of $PbTiO_3$-$PbZrO_3$-$PbB'_{1-\alpha} B''_\alpha O_3$, wherein:

B' is $Nb^{5+}$, $W^{6+}$;
B'' is $Zn^{2+}$, $Mg^{2+}$, $Co^{2+}$, $Mn^{2+}$, $Ni^{2+}$;
α is equal to ½ for $W^{6+}$, and ⅓ for $Nb^{5+}$, with the compositions pertaining to the morphotropic region, have the parameters shown in Table 1.

It follows from Table 1 that for many systems the values of the dielectric constant, the electromechanical force factor, and the mechanical Q-factor are insufficiently high, while the dielectric losses known for certain systems are excessively high.

Furthermore, in some cases, e.g. in the production of high frequency ultrasonic transducers, it is necessary to employ materials possessing low values of the dielectric constant $\epsilon^T_{33}$ at a relatively high electromechanical force factor $K_p$. The prior art materials (see for example Table 1), however, do not comply with this requirement.

SUMMARY OF THE INVENTION

It is an object of the present invention to provide highly efficient materials possessing high values of the dielectric constant $\epsilon^T_{33}$, the electromechanical force factor $K_p$, and the piezoelectric modulus $d_{31}$ which may be useful in acoustics, seismoscopes, and in other applications where piezomaterials should reveal maximum piezoelectric properties.

It is another object of the present invention to provide materials possessing low dielectric losses tgδ in weak (E=10 to 30 V/cm), but intense (E=2 kV/cm) fields and a high quality factor with sufficiently high piezoelectric parameters ($K_p$ and $d_{31}$). Such materials may be useful in hydroacoustics.

Still another object of the present invention is to provide materials possessing low values of the dielectric constant at a relatively high electromechanical force factor. Such materials may be useful in ultrasonic delay lines (UDL). Another object of the present invention, is to provide materials possessing a high mechanical Q-factor and a good stability at the resonance frequency. Such materials may be useful in filter technology.

TABLE 1

| No. | $PbB'_{1-\alpha} B''_\alpha O_3$ in ternary system | Reference | Dielectric constant $\epsilon_{33}^T$ | Electromechanical force factor $K_p$ | Mechanical quality factor Q | Dielectric losses (in weak field) tg δ. °K. |
|---|---|---|---|---|---|---|
| 1 | $PbNb_{⅔}Zn_{⅓}O_3$ | Japanese Patent No. 9,511/72 | 1,570–3,120 | 0.568–0.714 | — | — |
| 2 | $PbNb_{⅔}Mg_{⅓}O_3$ | H.Ouchi.J. Am. Ceram. Soc. 51, 169 (1968) | 2,137 | 0.638 | 65 | 1.87 |
| 3 | $PbNb_{⅔}CO_{⅓}O_3$ | Japanese Patent No. 13,146/70 | 1,360–2,030 | 0.64–0.73 | 305–420 | — |
| 4 | $PbNb_{⅔}Mn_{⅓}O_3$ | Japanese Patent No. 35,472/71 | 630–1,000 | 0.35–0.61 | 1,900–2,030 | 1.1–2.3 |
| 5 | $PbNb_{⅔}Ni_{⅓}O_3$ | Japanese Patent No. 45–14,465 | 720–3,200 | 0.4–0.61 | 95–161 | — |
| 6 | $Pb W_{½}Zn_{½}O_3$ | French Patent No. 1,554,730 | 1,500–2,500 | 0.52–0.59 | 72–80 | — |
| 7 | $Pb W_{½}Mg_{½}O_3$ | French Patent No. 1,551,976 | — | 0.25–0.5 | 295–300 | — |
| 1 | 2 | 3 | 4 | 5 | 6 | 7 |
| 8 | $PbW_{½}Ni_{½}O_3$ | French Patent No. 1,554,730 | 1,090–1,800 | 0,4–0.6 | 15–80 | — |
| 9 | $PbW_{½}CO_{½}O_3$ | Japanese Patent No. 46–2,354 | 1,130–1,980 | 0,42–0.63 | — | — |

These and other objects of the present invention are accomplished by providing a piezoceramic material comprising $PbTiO_3$, $PbZrO_3$, and $PbB'_{1-\alpha} B''_\alpha O_3$, wherein $B'=Nb^{5+}$, $W^{6+}$; $B''=Zn^{2+}$, $Mg^{2+}$, $Co^{2+}$, $Mn^{2+}$, $Ni^{2+}$; $\alpha=½$ for $W^{6+}$, and ⅓ for $Nb^{5+}$, and which material according to the present invention comprises a fourth component $PbB'''_{1-\alpha} B^{IV}_\alpha O_3$, wherein B''' is $Nb^{5+}$, $W^{6+}$; $B^{IV}=Zn^{2+}$, $Mg^{2+}$, $Co^{2+}$, $Mn^{2+}$, Ni; $\alpha=½$ for $W^{6+}$, and ⅓ for $Nb^{5+}$; with B' and B'''=$Nb^{5+}$, B''=$Ni^{2+}$, $B^{IV}$ is neither $Zn^{2+}$ nor $Mn^{2+}$; with B' and B'''=$Nb^{5+}$, B''=$Mg^{2+}$, $B^{IV}$ is not $Mn^{2+}$, the components being contained in the material in the following amounts, in molar percent:

$PbTiO_3$ = 30.0 to 52.5
$PbZrO_3$ = 25.0 to 47.6
$PbB'_{1-\alpha} B''_\alpha O_3$ = 1.5 to 28.4
$PbB'''_{1-\alpha} B^{IV}_\alpha O_3$ = 2.3 to 29.4

Within the above limits the following are preferred:
$PbTiO_3$ = 37.5 to 42.5
$PbZrO_3$ = 33.0 to 42.0
$PbB'_{1-\alpha} B''_\alpha O_3$ = 5.0 to 15.0
$PbB'''_{1-\alpha} B^{IV}_\alpha O_3$ = 5.0 to 15.0

The following is a list of piezoceramic materials referred to hereinafter as systems, the content of the components being given in molar percent:

| System 1 | | |
|---|---|---|
| $PbTiO_3$ | 32.5 to 45.0 | |
| $PbZrO_3$ | 26.0 to 44.5 | |
| $PbNb_{⅔}Zn_{⅓}O_3$ | 1.9 to 18.6 | (1) |
| $PbNb_{⅔}Mg_{⅓}O_3$ | 2.5 to 21.8 | |

The material may also contain, as a modifying oxide, from 3.6 to 3.9 mol.% of $MnO_2$ or from 0.83 to 0.86 mol.% of CoO.

| System 2 | |
|---|---|
| PbTiO$_3$ | 35.0 to 42.5 |
| PbZrO$_3$ | 27.0 to 39.3 |
| PbNb$_\frac{2}{3}$Zn$_\frac{1}{3}$O$_3$ | 2.0 to 17.8 (2) |
| PbNb$_\frac{2}{3}$Co$_\frac{1}{3}$O$_3$ | 2.9 to 26.5 |

This material may additionally contain, as a modifying oxide, from 3.5 to 3.7 mol.% of MnO$_2$ or 2.03 mol.% of Fe$_2$O$_3$.

| System 3 | |
|---|---|
| PbTiO$_3$ | 35.0 to 45.0 |
| PbZrO$_3$ | 25 to 42.55 |
| PbNb$_\frac{2}{3}$Mg$_\frac{1}{3}$O$_3$ | 2.4 to 21.6 (3) |
| PbNb$_\frac{2}{3}$Co$_\frac{1}{3}$O$_3$ | 2.8 to 27.6 |

This material may also contain, as a modifying oxide, from 1.9 to 3.8 mol.% of Mno$_2$.

| System 4 | |
|---|---|
| PbTiO$_3$ | 35.0 to 47.5 |
| PbZrO$_3$ | 36.22 to 44.94 (4) |
| PbNb$_\frac{2}{3}$Zn$_\frac{1}{3}$O$_3$ | 1.73 to 15.15 |
| PbNb$_\frac{2}{3}$Mn$_\frac{1}{3}$O$_3$ | 4.3 to 12.29 |

| System 5 | |
|---|---|
| PbTiO$_3$ | 37.5 to 45.0 |
| PbZrO$_3$ | 34.7 to 44.6 |
| PbNb$_\frac{2}{3}$Co$_\frac{1}{3}$O$_3$ | 3.5 to 21.4 (5) |
| PbNb$_\frac{2}{3}$Mn$_\frac{1}{3}$O$_3$ | 4.3 to 10.5 |

| System 6 | |
|---|---|
| PbTiO$_3$ | 30.0 to 42.5 |
| PbZrO$_3$ | 23.1 to 44.3 (6) |
| PbNb$_\frac{2}{3}$Mg$_\frac{1}{3}$O$_3$ | 8.3 to 22.7 |
| PbNb$_\frac{2}{3}$Ni$_\frac{1}{3}$O$_3$ | 4.3 to 29.4 |

The material may also contain, as a modifying oxide, from 0.76 to 3.8 mol.% of MnO$_2$.

| System 7 | |
|---|---|
| PbTiO$_3$ | 30.0 to 45.0 |
| PbZrO$_3$ | 25.4 to 47.6 |
| PbNb$_\frac{2}{3}$Ni$_\frac{1}{3}$O$_3$ | 2.3 to 22.7 (7) |
| PbNb$_\frac{2}{3}$Co$_\frac{1}{3}$O$_3$ | 4.1 to 29.4 |

The material may also contain from 1.9 to 3.8 mol.% of MnO$_2$ as a modifying agent.

| System 8 | |
|---|---|
| PbTiO$_3$ | 32.5 to 42.5 |
| PbZrO$_3$ | 32.8 to 42.8 (8) |
| PbW$_\frac{1}{2}$Zn$_\frac{1}{2}$O$_3$ | 6.1 to 17.8 |
| PbNb$_\frac{2}{3}$Zn$_\frac{1}{3}$O$_3$ | 5.7 to 15.0 |

The material may also contain from 0.76 to 1.9 mol.% of MnO$_2$ as a modifying oxide.

| System 9 | |
|---|---|
| PbTiO$_3$ | 32.5 to 45.0 |
| PbZrO$_3$ | 30.0 to 46.4 (9) |
| PbW$_\frac{1}{2}$Zn$_\frac{1}{2}$O$_3$ | 6.1 to 16.2 |
| PbNb$_\frac{2}{3}$Co$_\frac{1}{3}$O$_3$ | 8.0 to 21.8 |

The material may additionally contain, as a modifying oxide, from 0.77 to 3.8 mol.% of MnO$_2$.

| System 10 | |
|---|---|
| PbTiO$_3$ | 32.5 to 45.0 |
| PbZrO$_3$ | 33.4 to 42.8 (10) |
| PbW$_\frac{1}{2}$Mg$_\frac{1}{2}$O$_3$ | 6.1 to 15.0 |
| PbNb$_\frac{2}{3}$Zn$_\frac{1}{3}$O$_3$ | 5.4 to 15.0 |

It is advisable to incorporate into the material, as a modifying oxide, from 0.76 to 3.8 mol.% of MnO$_2$.

| System 11 | |
|---|---|
| PbTiO$_3$ | 35.0 to 45.0 |
| PbZrO$_3$ | 30.6 to 44.5 (11) |
| PbW$_\frac{1}{2}$Mg$_\frac{1}{2}$O$_3$ | 6.1 to 14.0 |
| PbNb$_\frac{2}{3}$Co$_\frac{1}{3}$O$_3$ | 6.9 to 17.2 |

| System 12 | |
|---|---|
| PbTiO$_3$ | 35.0 to 45.0 |
| PbZrO$_3$ | 32.3 to 44.6 (12) |
| PbW$_\frac{1}{2}$Mg$_\frac{1}{2}$O$_3$ | 6.1 to 16.2 |
| PbNb$_\frac{2}{3}$Ni$_\frac{1}{3}$O$_3$ | 4.1 to 11.7 |

As a modifying oxide, there may be added to this material from 0.76 to 1.9 mol.% of MnO$_2$.

| System 13 | |
|---|---|
| PbTiO$_3$ | 35.0 to 52.5 |
| PbZrO$_3$ | 33.58 to 44.2 |
| PbW$_\frac{1}{2}$Mg$_\frac{1}{2}$O$_3$ | 4.48 to 11.37 (13) |
| PbNb$_\frac{2}{3}$Mn$_\frac{1}{3}$O$_3$ | 6.1 to 16.19 |

| System 14 | |
|---|---|
| PbTiO$_3$ | 37.5 to 42.5 |
| PbZrO$_3$ | 32.8 to 39.4 |
| PbW$_\frac{1}{2}$Mg$_\frac{1}{2}$O$_3$ | 6.4 to 16.2 (14) |
| PbW$_\frac{1}{2}$Zn$_\frac{1}{2}$O$_3$ | 6.4 to 15.5 |

| System 15 | |
|---|---|
| PbTiO$_3$ | 37.5 to 45.0 |
| PbZrO$_3$ | 34.7 to 44.9 |
| PbW$_\frac{1}{2}$Ni$_\frac{1}{2}$O$_3$ | 4.3 to 11.4 (15) |
| PbNb$_\frac{2}{3}$Zn$_\frac{1}{3}$O$_3$ | 5.7 to 14.4 |

This material may additionally contain, as a modifying oxide, from 0.76 to 1.9 mol.% of MnO$_2$.

| System 16 | |
|---|---|
| PbTiO$_3$ | 37.5 to 42.5 |
| PbZrO$_3$ | 30.0 to 42.0 |
| PbW$_\frac{1}{2}$Ni$_\frac{1}{2}$O$_3$ | 1.5 to 13.5 (16) |

-continued

| System 16 | |
|---|---|
| PbNb$_{2/3}$Mg$_{1/3}$O$_3$ | 2.3 to 22.0 |

The material may contain, as a modifying oxide from 0.76 to 3.8 mol.% of MnO$_2$.

| System 17 | | |
|---|---|---|
| PbTiO$_3$ | 35.0 to 42.5 | |
| PbZrO$_3$ | 22.9 to 45.6 | (17) |
| PbW$_{1/2}$Ni$_{1/2}$O$_3$ | 5.32 to 14.1 | |
| PbNb$_{2/3}$Co$_{1/3}$O$_3$ | 3.6 to 21.8 | |

| System 18 | | |
|---|---|---|
| PbTiO$_3$ | 37.5 to 45.0 | |
| PbZrO$_3$ | 36.8 to 45.3 | (18) |
| PbW$_{1/2}$Ni$_{1/2}$O$_3$ | 5.12 to 13.54 | |
| PbNb$_{2/3}$Mn$_{1/3}$O$_3$ | 4.48 to 11.37 | |

| System 19 | | |
|---|---|---|
| PbTiO$_3$ | 32.5 to 45.0 | |
| PbZrO$_3$ | 38.4 to 42.5 | |
| PbNb$_{2/3}$Ni$_{1/3}$O$_3$ | 4.1 to 28.4 | (19) |
| PbW$_{1/2}$Ni$_{1/2}$O$_3$ | 5.8 to 13.6 | |

This material may contain, as a modifying oxide, from 0.76 to 1.9 mol.% of MnO$_2$.

| System 20 | | |
|---|---|---|
| PbTiO$_3$ | 37.5 to 45.0 | |
| PbZrO$_3$ | 32.5 to 42.0 | |
| PbW$_{1/2}$Mg$_{1/2}$O$_3$ | 6.7 to 16.2 | (20) |
| PbW$_{1/2}$Ni$_{1/2}$O$_3$ | 5.1 to 13.6 | |

| System 21 | | |
|---|---|---|
| PbTiO$_3$ | 35.0 to 45.0 | |
| PbZrO$_3$ | 32.2 to 44.7 | (21) |
| PbW$_{1/2}$Co$_{1/2}$O$_3$ | 4.1 to 10.0 | |
| PbNb$_{2/3}$Co$_{1/3}$O$_3$ | 8.1 to 21.8 | |

| System 22 | | |
|---|---|---|
| PbTiO$_3$ | 37.5 to 45.0 | |
| PbZrO$_3$ | 36.2 to 42.8 | |
| PbW$_{1/2}$Mg$_{1/2}$O$_3$ | 6.1 to 16.0 | (22) |
| PbW$_{1/2}$Co$_{1/2}$O$_3$ | 4.3 to 12.8 | |

| System 23 | | |
|---|---|---|
| PbTiO$_3$ | 37.5 to 45.0 | |
| PbZrO$_3$ | 35.7 to 43.9 | |
| PbW$_{1/2}$Ni$_{1/2}$O$_3$ | 4.1 to 11.0 | (23) |
| PbW$_{1/2}$Co$_{1/2}$O$_3$ | 5.4 to 13.0 | |

| System 24 | | |
|---|---|---|
| PbTiO$_3$ | 30.0 to 45.0 | |
| PbZrO$_3$ | 25.0 to 47.6 | |
| PbW$_{1/2}$Zn$_{1/2}$O$_3$ | 1.5 to 28.4 | (24) |
| PbNb$_{2/3}$Mg$_{1/3}$O$_3$ | 2.3 to 29.4 | |

| System 25 | | |
|---|---|---|
| PbTiO$_3$ | 30.0 to 45.0 | |
| PbZrO$_3$ | 25.0 to 47.6 | |
| PbW$_{1/2}$Co$_{1/2}$O$_3$ | 1.5 to 28.4 | (25) |
| PbNb$_{2/3}$Zn$_{1/3}$O$_3$ | 2.3 to 29.4 | |

| System 26 | | |
|---|---|---|
| PbTiO$_3$ | 30.0 to 45.0 | |
| PbZrO$_3$ | 25.0 to 47.6 | |
| PbW$_{1/2}$Zn$_{1/2}$O$_3$ | 1.5 to 28.4 | (26) |
| PbNb$_{2/3}$Ni$_{1/3}$O$_3$ | 2.3 to 29.4 | |

| System 27 | | |
|---|---|---|
| PbTiO$_3$ | 30.0 to 45.0 | |
| PbZrO$_3$ | 25.0 to 47.6 | |
| PbNb$_{2/3}$Ni$_{1/3}$O$_3$ | 1.5 to 28.4 | (27) |
| PbW$_{1/2}$Co$_{1/2}$O$_3$ | 2.3 to 29.4 | |

| System 28 | | |
|---|---|---|
| PbTiO$_3$ | 30.0 to 45.0 | |
| PbZrO$_3$ | 25.0 to 47.6 | |
| PbW$_{1/2}$Co$_{1/2}$O$_3$ | 1.5 to 28.4 | (28) |
| PbNb$_{2/3}$Mg$_{1/3}$O$_3$ | 2.3 to 29.4 | |

| System 29 | | |
|---|---|---|
| PbTiO$_3$ | 37.5 to 42.5 | |
| PbZrO$_3$ | 40.5 to 37.26 | |
| PbW$_{1/2}$Ni$_{1/2}$O$_3$ | 5.34 to 5.82 | (29) |
| PbW$_{1/2}$Zn$_{1/2}$O$_3$ | 14.9 to 16.18 | |

| System 30. | | |
|---|---|---|
| PbTiO$_3$ | 37.5 to 45.0 | |
| PbZrO$_3$ | 36.85 to 46.69 | |
| PbW$_{1/2}$Co$_{1/2}$O$_3$ | 4.12 to 10.94 | (30) |
| PbNb$_{2/3}$Mn$_{1/3}$O$_3$ | 4.30 to 10.92 | |

| System 31 | | |
|---|---|---|
| PbTiO$_3$ | 37.5 to 45.0 | |
| PbZrO$_3$ | 36.25 to 42.42 | |
| PbW$_{1/2}$Zn$_{1/2}$O$_3$ | 6.1 to 16.38 | (31) |
| PbNb$_{2/3}$Mn$_{1/3}$O$_3$ | 4.68 to 11.37 | |

| System 32 | | |
|---|---|---|
| PbTiO$_3$ | 35.0 to 42.5 | |
| PbZrO$_3$ | 38.29 to 43.29 | |
| PbW$_{1/2}$Zn$_{1/2}$O$_3$ | 14.9 to 16.83 | (32) |
| PbW$_{1/2}$Co$_{1/2}$O$_3$ | 4.31 to 4.88 | | compositions of these Systems are shown in Table 3 below.

TABLE 2

| System No. | Composition, mol. % | | | | Electrophysical parameters | | |
|---|---|---|---|---|---|---|---|
| 1 | 2 | 3 | 4 | 5 | 6 | 7 | 8 |
| | PbTiO$_3$ | PbZrO$_3$ | PbB'$_{1-\alpha}$B"$_\alpha$O$_3$ | PbB'''$_{1-\alpha}$B"$_\alpha$O$_3$ | $\epsilon_{33}^T$ | Kp | $d_{31} \cdot 10^6$ CGSE units |
| 1 | 42.50 | 40.7 | PBNB$_\frac{2}{3}$Zn$_\frac{1}{3}$O$_3$ 4.3 | PBNB$_\frac{2}{3}$Mg$_\frac{1}{3}$O$_3$ 12.5 | 2.260 | 0.67 | 6.6 |
| 3 | 42.50 | 42.55 | PBNB$_\frac{2}{3}$Mg$_\frac{1}{3}$O$_3$ 7.18 | PBNB$_\frac{2}{3}$Co$_\frac{1}{3}$O$_3$ 7.77 | 2.210 | 0.67 | 6.03 |
| 6 | 42.50 | 39.16 | PBNB$_\frac{2}{3}$Mg$_\frac{1}{3}$O$_3$ 8.29 | PBNB$_\frac{2}{3}$Ni$_\frac{1}{3}$O$_3$ 10.05 | 3.130 | 0.677 | 7.8 |
| 7 | 35.00 | 28.34 | PBNB$_\frac{2}{3}$Ni$_\frac{1}{3}$O$_3$ 27.30 | PBNB$_\frac{2}{3}$Co$_\frac{1}{3}$O$_3$ 9.36 | 2.699 | 0.656 | 6.44 |
| 8 | 40.00 | 39.48 | PBW$_\frac{1}{2}$Zn$_\frac{1}{2}$O$_3$ 6.66 | PBNB$_\frac{2}{3}$Zn$_\frac{1}{3}$O$_3$ 13.86 | 2.555 | 0.658 | 6.72 |
| 10 | 40.00 | 39.48 | PBW$_\frac{1}{2}$Mg$_\frac{1}{2}$O$_3$ 6.66 | PBNB$_\frac{2}{3}$Zn$_\frac{1}{3}$O$_3$ 13.86 | 2.762 | 0.703 | 7.65 |
| 9 | 42.50 | 42.66 | PBW$_\frac{1}{2}$Zn$_\frac{1}{2}$O$_3$ 6.38 | PBNB$_\frac{2}{3}$Co$_\frac{1}{3}$O$_3$ 8.46 | 2.159 | 0.65 | 5.67 |
| 15 | 42.50 | 39.73 | PBW$_\frac{1}{2}$Ni$_\frac{1}{2}$O$_3$ 4.48 | PBNB$_\frac{2}{3}$Zn$_\frac{1}{3}$O$_3$ 13.29 | 2.480 | 0.613 | 5.92 |
| 11 | 42.50 | 37.37 | PBW$_\frac{1}{2}$Mg$_\frac{1}{2}$O$_3$ 12.88 | PBNB$_\frac{2}{3}$Co$_\frac{1}{3}$O$_3$ 7.25 | 2.973 | 0.618 | 6.23 |
| 12 | 40.00 | 36.60 | PBW$_\frac{1}{2}$Mg$_\frac{1}{2}$O$_3$ 13.10 | PBNB$_\frac{2}{3}$Ni$_\frac{1}{3}$O$_3$ 10.30 | 3.166 | 0.652 | 7.33 |
| 14 | 40.00 | 37.80 | PBW$_\frac{1}{2}$Ng$_\frac{1}{2}$O$_3$ 6.66 | PBW$_\frac{1}{2}$Zn$_\frac{1}{2}$O$_3$ 15.54 | 2.634 | 0.675 | 7.06 |
| 16 | 40.00 | 35.40 | PBNB$_\frac{2}{3}$Mg$_\frac{1}{3}$O$_3$ 14.76 | PBW$_\frac{1}{2}$Ni$_\frac{1}{2}$O$_3$ 9.84 | 3.860 | 0.722 | 9.38 |
| 17 | 40.00 | 34.26 | PBW$_\frac{1}{2}$Ni$_\frac{1}{2}$O$_3$ 5.58 | PBNB$_\frac{2}{3}$Co$_\frac{1}{3}$O$_3$ 20.16 | 2.730 | 0.645 | 6.42 |
| 19 | 35.00 | 31.65 | PBNB$_\frac{2}{3}$Ni$_\frac{1}{3}$O$_3$ 27.30 | PBW$_\frac{1}{2}$Ni$_\frac{1}{2}$O$_3$ 6.05 | 4.441 | 0.608 | 7.66 |
| | 37.50 | 30.44 | PBNB$_\frac{2}{3}$Ni$_\frac{1}{3}$O$_3$ 26.25 | PBW$_\frac{1}{2}$Ni$_\frac{1}{2}$O$_3$ 5.81 | 2.360 | 0.655 | 6.14 |
| 21 | 37.50 | 35.00 | PBW$_\frac{1}{2}$Co$_\frac{1}{2}$O$_3$ 9.62 | PBNB$_\frac{2}{3}$Co$_\frac{1}{3}$O$_3$ 17.88 | 3.368 | 0.622 | 6.65 |
| 22 | 42.50 | 38.29 | PBW$_\frac{1}{2}$Mg$_\frac{1}{2}$O$_3$ 14.89 | PBW$_\frac{1}{2}$Co$_\frac{1}{2}$O$_3$ 4.32 | 2.390 | 0.605 | 5.42 |
| 23 | 42.50 | 4071 | PBW$_\frac{1}{2}$Ni$_\frac{1}{2}$O$_3$ 4.31 | PBW$_\frac{1}{2}$Co$_\frac{1}{2}$O$_3$ 12.48 | 2.387 | 0.633 | 5.84 |

| System 33 | | |
|---|---|---|
| PbTiO$_3$ | 35.0 to 42.5 | |
| PbZrO$_3$ | 28.18 to 35.82 | |
| PbW$_\frac{1}{2}$Mg$_\frac{1}{2}$O$_3$ | 12.9 to 15.54 | (33) |
| PbNb$_\frac{2}{3}$Mg$_\frac{1}{3}$O$_3$ | 8.28 to 18.56 | | the majority of the above Systems possess high piezoelectric parameters.

Some parameters of the best compositions among these highly efficient Systems are shown in Table 2 hereinbelow.

Therefore, the best compositions of the highly efficient Systems have:

$\epsilon_{33}^T = 2{,}159$ to $4{,}441$ $K_p = 0.605$ to $0.722$ $d_{31} = (5.42$ to $9.38) \cdot 10^{-6}$ CGSE units.

These materials may find application in acoustics, seisomoscopes, and in other utilities where piezomaterials should reveal maximal piezoelectric properties.

Cobalt-containing Systems possess, in addition to the high piezoelectric characteristics thereof, an improved value of mechanical quality factor Q=260 to 600.

In the manganese-containing Systems, the majority of compositions have low dielectric losses in weak and intense fields: tgδ (weak field)=0.2 to 1.0%; tgδ (intense field, E=2 kv/cm)=1.0 to 3.4% and a high mechanical quality Q=400 to 2,500 at sufficiently high piezoelectric parameters; this is very valuable for materials employed in hydroacoustics. Parameters of some Some of the materials of the present invention (see, for example, Table 4) possess low values of the dielectric constant at a relatively high electromechanical force factor, which makes it possible for them to be employed in ultrasonic delay lines (UDL).

Some of the compositions (see, for example, Table 5 below show a rather high mechanical Q-factor at a comparatively high electromechanical factor $K_p$.

Parameters of some of such compositions are given in Table 5.

Some compositions have a good stability of the resonance frequency $f_r$ within a temperature range of from −40° to +80° C. (Table 6) in addition to their sufficiently high mechanical Q-factor and high electromechanical force factor values, which enables the use thereof in filter technology.

Modification of the piezoceramic material according to the present invention makes it possible, in some cases, to produce even more efficient dielectric and piezoceramic parameters.

Thus, the introduction into some systems of from 0.76 to 3.9 mol. % of MnO$_2$ or from 0.83 to 0.86 mol. % of CoO substantially reduces the dielectric losses in intense fields, improves the mechanical Q-factor, makes it possible to produce compositions with low dielectric losses with relatively high piezoelectric parameters $K_p$ and $d_{31}$, and results in a combination of a low dielectric constant with a relatively high electromechanical force factor, which is very important in ultrasonic delay lines.

Data illustrating dielectric and piezoelectric characteristics of pure tested and best modified compositions of some systems of the present invention are given in Table 7.

TABLE 3

| System No. | Composition, mol. % | | | | Electrophysical Parameters | | | | | |
|---|---|---|---|---|---|---|---|---|---|---|
| | PbTiO$_3$ | PbZrO$_3$ | PbB'$_{1-\alpha}$B''$_\alpha$O$_3$ | PbB'$_{1-\alpha}$B''$_\alpha$O$_3$ | tg$\delta$, % weak field | E=2 kv/cm | Kp | units $\epsilon_{33}^T$ | $d_{31} \cdot 10^6$ CGSE | Q |
| 4 | 42.5 | 39.73 | PBNB$_{\frac{2}{3}}$Zn$_{\frac{1}{3}}$O$_3$ 13.29 | PBNB$_{\frac{2}{3}}$Mn$_{\frac{1}{3}}$O$_3$ 4.48 | 0.24 | 1.0 | 0.577 | 1.310 | 3.65 | 1,000 |
| 5 | 42.5 | 44.56 | PBNB$_{\frac{2}{3}}$Co$_{\frac{1}{3}}$O$_3$ 8.45 | PBNB$_{\frac{2}{3}}$Mn$_{\frac{1}{3}}$O$_3$ 4.49 | 0.28 | 1.5 | 0.646 | 1.340 | 4.34 | 1,000 |
| 13 | 45.00 | 42.90 | PBW$_{\frac{1}{2}}$Mg$_{\frac{1}{2}}$O$_3$ 7.27 | PBNB$_{\frac{2}{3}}$Mn$_{\frac{1}{3}}$O$_3$ 4.83 | 0.35 | 2.0 | 0.662 | 1.970 | 5.70 | 900 |
| 13 | 43.75 | 37.30 | PBW$_{\frac{1}{2}}$Mg$_{\frac{1}{2}}$O$_3$ 14.56 | PBNB$_{\frac{2}{3}}$Mn$_{\frac{1}{3}}$O$_3$ 4.39 | 0.19 | 2.9 | 0.647 | 2.550 | 6.28 | 770 |
| 18 | 42.5 | 40.54 | PBW$_{\frac{1}{2}}$Ni$_{\frac{1}{2}}$O$_3$ 12.48 | PBNB$_{\frac{2}{3}}$Mn$_{\frac{1}{3}}$O$_3$ 4.48 | 0.34 | 3.1 | 0.639 | 2.270 | 68 | |

TABLE 4

| System No. | Composition, mol. % | | | | Electrophysical parameters | |
|---|---|---|---|---|---|---|
| | PbTiO$_3$ | PbZiO$_3$ | PbB$_{1-\alpha}^I$B$_\alpha^{II}$O$_3$ | PbB$_{1-\alpha}^{III}$B$_\alpha^{IV}$O$_3$ | $\epsilon_{33}^T$ | Kp |
| 13 | 42.50 | 36.86 | PBW$_{\frac{1}{2}}$Mg$_{\frac{1}{2}}$O$_3$ 19.14 | PBNB$_{\frac{2}{3}}$Mn$_{\frac{1}{3}}$O$_3$ 1.5 | 434 | 0.509 |
| 18 | 40.0 | 43.5 | PBW$_{\frac{1}{2}}$Ni$_{\frac{1}{2}}$O$_3$ 5.58 | PBNB$_{\frac{2}{3}}$Mn$_{\frac{1}{3}}$O$_3$ 10.92 | 500 | 0.518 |
| 5 | 40.0 | 45.72 | PBNB$_{\frac{2}{3}}$Co$_{\frac{1}{3}}$O$_3$ 3.78 | PBNB$_{\frac{2}{3}}$Mn$_{\frac{1}{3}}$O$_3$ 10.5 | 510 | 0.532 |
| 13 | 45.00 | 30.26 | PBW$_{\frac{1}{2}}$Mg$_{\frac{1}{2}}$O$_3$ 14.84 | PBNB$_{\frac{2}{3}}$Mn$_{\frac{1}{3}}$O$_3$ 9.9 | 518 | 0.536 |
| 10 | 42.50 | 46.00 | PBW$_{\frac{1}{2}}$Mg$_{\frac{1}{2}}$O$_3$ 5.75 | PBNB$_{\frac{2}{3}}$Zn$_{\frac{1}{3}}$O$_3$ 5.75 | 845 | 0.610 |

TABLE 5

| System No. | Composition, mol. % | | | | Electrophysical parameters | |
|---|---|---|---|---|---|---|
| | PbTiO$_3$ | PbZiO$_3$ | PbB$_{1-\alpha}^I$B$_\alpha^{II}$O$_3$ | PbB$_{1-\alpha}^{III}$B$_\alpha^{IV}$O$_3$ | Q | Kp |
| 4 | 35.0 | 40.95 | PBNB$_{\frac{2}{3}}$Zn$_{\frac{1}{3}}$O$_3$ 15.15 | PBNB$_{\frac{2}{3}}$Mn$_{\frac{1}{3}}$O$_3$ 8.9 | 2,120 | 0.49 |
| 4 | 37.5 | 43.18 | PBNB$_{\frac{2}{3}}$Zn$_{\frac{1}{3}}$O$_3$ 14.44 | PBNB$_{\frac{2}{3}}$Mn$_{\frac{1}{3}}$O$_3$ 4.88 | 1,910 | 0.52 |
| 5 | 42.5 | 38.58 | PBNB$_{\frac{2}{3}}$Co$_{\frac{1}{3}}$O$_3$ 8.45 | PBNB$_{\frac{2}{3}}$Mn$_{\frac{1}{3}}$O$_3$ 10.47 | 2,370 | 0.52 |
| 18 | 37.5 | 45.31 | PBW$_{\frac{1}{2}}$Ni$_{\frac{1}{2}}$O$_3$ 5.82 | PBNB$_{\frac{2}{3}}$Mn$_{\frac{1}{3}}$O$_3$ 11.37 | 2,360 | 0.52 |
| 30 | 42.50 | 38.52 | PBW$_{\frac{1}{2}}$Co$_{\frac{1}{2}}$O$_3$ 9.1 | PBNB$_{\frac{2}{3}}$Mn$_{\frac{1}{3}}$O$_3$ 9.88 | 2,440 | 0.51 |

TABLE 6

| System No. | Composition, mol. % | | | | Electrophysical parameters | | | |
|---|---|---|---|---|---|---|---|---|
| | PbTiO$_3$ | PbZrO$_3$ | PbB$_{1-\alpha}^I$B$_\alpha^{II}$O$_3$ | PbB$_{1-\alpha}^{III}$B$_\alpha^{IV}$O$_3$ | Q | K$_p$ | $\frac{fr_{t^\circ} - fr_{20^\circ}}{fr_{20^\circ}} \cdot 1M$ % | |
| 13 | 52.5 | 33.58 | PbW$_{\frac{1}{2}}$Mg$_{\frac{1}{2}}$O$_3$ 5.28 | PbNb$_{\frac{2}{3}}$Mn$_{\frac{1}{3}}$O$_3$ 8.64 | 1,150 | 0.33 | <0.15 | |
| 5 | 45.0 | 38.5 | PbNb$_{\frac{2}{3}}$Co$_{\frac{1}{3}}$O$_3$ 7.26 | PbNb$_{\frac{2}{3}}$Mn$_{\frac{1}{3}}$O$_3$ 9.24 | 1,300 | 0.44 | <0.2 | |
| 5 | 45.0 | 36.9 | PbNb$_{\frac{2}{3}}$Co$_{\frac{1}{3}}$O$_3$ 8.08 | PbNb$_{\frac{2}{3}}$Mn$_{\frac{1}{3}}$O$_3$ 10.02 | 1,480 | 0.43 | <0.2 | |
| 4 | 47.5 | 38.48 | PbNb$_{\frac{2}{3}}$Zn$_{\frac{1}{3}}$O$_3$ 1.73 | PbNb$_{\frac{2}{3}}$Mn$_{\frac{1}{3}}$O$_3$ 12.29 | 890 | 0.46 | <0.2 | |

TABLE 7

| System No. | Composition, mol. % | | | | Modifying agent | Electrophysical parameters | | | | | |
|---|---|---|---|---|---|---|---|---|---|---|---|
| | PbTiO$_3$ | PbZrO$_3$ | PbB$^I_{1-\alpha}$B$^{II}_\alpha$O$_3$ | PbB$^{III}_{1-\alpha}$B$^{IV}_\alpha$O$_3$ | | $\epsilon^T_{33}$ | tg$\delta$, % in weak field | tg$\delta$, % E = 2 $\frac{kv}{cm}$ | K$_p$ | d$_{31}$·10$^6$ units CGSE | Q |
| 1 | 2 | 3 | 4 | 5 | 6 | 7 | 8 | 9 | 10 | 11 | 12 |
| 1 | 32.5 | 40.7 | PbNb$_{2/3}$Zn$_{1/3}$O$_3$ 2.3 | PbNb$_{2/3}$Mg$_{1/3}$O$_3$ 24.5 | — | 820 | 2.83 | 34.0 | 0.456 | 2.23 | 130 |
| " | " | " | " | " | MnO$_2$ 3.7 | 400 | 0.3 | 1.1 | 0.4 | 1.23 | 2,530 |
| | 35.0 | 42.2 | PbNb$_{2/3}$Zn$_{1/3}$O$_3$ 15.0 | PbNb$_{2/3}$Mg$_{1/3}$O$_3$ 7.8 | — | 860 | 2.6 | 28.3 | 0.508 | 2.67 | 110 |
| " | " | " | " | " | MnO$_2$ 3.9 | 420 | 0.22 | 1.25 | 0.446 | 1.45 | 2,280 |
| | 35.0 | 52.7 | PbNb$_{2/3}$Zn$_{1/3}$O$_3$ 5,4 | PbNb$_{2/3}$Mg$_{1/3}$O$_3$ 6.9 | — | 680 | 2,96 | 27.0 | 0.391 | 1.75 | 136 |
| " | " | " | " | " | MnO$_2$ 3.6 | 360 | 0,24 | 1.3 | 0.397 | 1.13 | 1.900 |
| | 40,0 | 48.6 | PbNb$_{2/3}$Zn$_{1/3}$O$_3$ 5,0 | PbNb$_{2/3}$Mg$_{1/3}$O$_3$ 6.4 | — | 797 | 2,82 | — | 0.554 | 2.86 | 102 |
| " | " | " | " | " | MnO$_2$ 3.7 | 405 | 0,3 | 1.6 | 0.478 | 1.52 | 2.185 |
| " | 40,0 | 38.9 | PbNb$_{2/3}$Zn$_{1/3}$O$_3$ 13,9 | PbNb$_{2/3}$Mg$_{1/3}$O$_3$ 7.2 | — | 1,970 | 2,4 | 11.8 | 0.643 | 5.58 | 77 |
| " | " | " | " | " | CoO 0.86 | 1,940 | 0,5 | 7.0 | 0.654 | 5.48 | 374 |
| 2 | 40,0 | 40.8 | PbNb$_{2/3}$Zn$_{1/3}$O$_3$ 8,3 | PbNb$_{2/3}$Co$_{1/3}$O$_3$ 10.9 | — | 880 | 1,03 | 15.9 | 0.512 | 2.9 | 266 |
| " | " | " | " | " | MnO$_2$ 3.5 | 490 | 0,56 | 1.8 | 0.518 | 1.86 | 1.890 |
| 3 | 42.5 | 33.98 | PbNb$_{2/3}$Mg$_{1/3}$O$_3$ 20.7 | PbNb$_{2/3}$Co$_{1/3}$O$_3$ 2.82 | — | 2,400 | 0.97 | 8.3 | 0.625 | 5.7 | 120 |
| " | " | " | " | " | MnO$_2$ 1.9 | 2,000 | 0.27 | 2.8 | 0.66 | 5.58 | 760 |
| " | 35.0 | 38.42 | PbNb$_{2/3}$Mg$_{1/3}$O$_3$ 23.4 | PbNb$_{2/3}$Co$_{1/3}$O$_3$ 3.18 | — | 760 | 1.3 | 21.1 | 0.542 | 2.545 | 155 |
| " | " | " | " | " | MnO$_2$ 3.8 | 506 | 0.24 | 0.75 | 0.446 | 1.58 | 107 |
| 6 | 35.0 | 28.34 | PbNb$_{2/3}$Mg$_{1/3}$O$_3$ 9.36 | PbNb$_{2/3}$NiO$_3$ 27.3 | — | 3,740 | 1.8 | 15.0 | 0.642 | 7.67 | 67 |
| " | " | " | " | " | MnO$_2$ 0.76 | 1,960 | 0.23 | 4.85 | 0.611 | 5.07 | 250 |
| " | 37.5 | 42.56 | PbNb$_{2/3}$Mg$_{1/3}$O$_3$ 9.0 | PbNb$_{2/3}$Ni$_{1/3}$O$_3$ 10.94 | — | 755 | 2.2 | 38.5 | 0.582 | 2.7 | 130 |
| " | " | " | " | " | MnO$_2$ 3.8 | 524 | 0.38 | 2.0 | 0.510 | 1.31 | 750 |
| 7 | 35.0 | 28.34 | PbNb$_{2/3}$Ni$_{1/3}$O$_3$ 9.36 | PbNb$_{2/3}$Co$_{1/3}$O$_3$ 27.3 | — | 2,700 | 1.98 | 13.35 | 0.656 | 6.44 | 250 |
| " | " | " | " | " | MnO$_2$ 1.9 | 1,240 | 0.57 | 1.4 | 0.576 | 3.55 | 6 |
| 8 | 40.0 | 39.48 | PbW$_{1/2}$Zn$_{1/2}$O$_3$ 6.66 | PbNb$_{2/3}$Zn$_{1/3}$O$_3$ 13.86 | — | 2,560 | 1.49 | 10.0 | 0.658 | 6.72 | 56 |
| " | " | " | " | " | MnO$_2$ 1.9 | 1,690 | 0.5 | 1.3 | 0.595 | 4.41 | 620 |
| 9 | 40.0 | 33.18 | PbW$_{1/2}$Zn$_{1/2}$O$_3$ 6.66 | PbNb$_{2/3}$Co$_{1/3}$O$_3$ 20.16 | — | 2,130 | 2.26 | 13.5 | 0.64 | 5.53 | 280 |
| " | " | " | " | " | MnO$_2$ 19. | 1,620 | 0.5 | 2.0 | 0.555 | 4.1 | 650 |
| " | 37.5 | 37.31 | PbW$_{1/2}$Zn$_{1/2}$O$_3$ 16.8 | PbNb$_{2/3}$Co$_{1/3}$O$_3$ 9.01 | — | 720 | 1.08 | 11.8 | 0.53 | 2.45 | 276 |
| " | " | " | " | " | MnO$_2$ 3.8 | 467 | 0.61 | 1.4 | 0.427 | 1.5 | 740 |
| 10 | 40.0 | 39.48 | PbW$_{1/2}$Mg$_{1/2}$O$_3$ 6.66 | PbNb$_{2/3}$Zn$_{1/3}$O$_3$ 13.86 | — | 2,60 | 1.35 | 15.0 | 0.703 | 7.65 | 67 |
| " | " | " | " | " | MnO$_2$ 1.9 | 2,030 | 0.33 | 1.4 | 0.583 | 4.7 | 710 |
| 12 | 40.0 | 39.96 | PbW$_{1/2}$Mg$_{1/2}$O$_3$ 15.54 | PbNb$_{2/3}$Ni$_{1/3}$O$_3$ 4.5 | — | 3,320 | 1.44 | 15.8 | 0.628 | 6.95 | 110 |
| " | " | " | " | " | MnO$_2$ 1.9 | 2,240 | 0.61 | 1.65 | 0.602 | 5.22 | 590 |
| 15 | 42.5 | 39.73 | PbW$_{1/2}$Ni$_{1/2}$O$_3$ 4.48 | PbNb$_{2/3}$Zn$_{1/3}$O$_3$ 13.29 | — | 2,480 | 1.2 | 9.4 | 0.613 | 5.89 | 83 |
| " | " | " | " | " | MnO$_2$ 1.9 | 1,910 | 0.52 | 1.7 | 0.657 | 5.42 | |
| 19 | 40.0 | 36.6 | PbNb$_{2/3}$Ni$_{1/3}$O$_3$ 11.46 | PbW$_{1/2}$Ni$_{1/2}$O$_3$ 11.94 | — | 3,010 | 1.48 | 12.0 | 0.637 | 6.73 | 89 |
| " | " | " | " | " | MnO$_2$ 1.9 | 1,000 | 0.42 | 1.0 | 0.565 | 3.1 | 840 |
| 16 | 38.75 | 30.62 | PbNb$_{2/3}$Mg$_{1/3}$O$_3$ 18.37 | PbW$_{1/2}$Ni$_{1/2}$O$_3$ 12.25 | — | 4,260 | 1.78 | 17.0 | 0.675 | 8.82 | 70 |
| | | | | | MnO$_2$ | | | | | | |

TABLE 7-continued

| System No. 1 | Composition, mol. % | | | | Modifying agent 6 | Electrophysical parameters | | | | | |
|---|---|---|---|---|---|---|---|---|---|---|---|
| | | | | | | | tgδ, % | | | $d_{31} \cdot 10^6$ units | |
| | PbTiO$_3$ 2 | PbZrO$_3$ 3 | PbB$^{I}_{1-a}$B$^{II}_{a}$O$_3$ 4 | PbB$^{III}_{1-a}$B$^{IV}_{a}$O$_3$ 5 | | $\epsilon^T_{33}$ 7 | in weak field 8 | $E = 2 \frac{kv}{cm}$ 9 | $K_p$ 10 | CGSE 11 | Q 12 |
| | " | " | " | " | 0.76 | 2,580 | 0.29 | 5.0 | 0.651 | 6.36 | 218 |
| " | 38.75 | 30.62 | PbNb⅔Mg⅓O$_3$ 18.37 | PbW½Ni½O$_3$ 12.25 | — | 4,260 | 1.77 | 17.0 | 0.675 | 8.82 | 70 |
| " | " | " | " | " | MnO$_2$ 1.9 | 2,080 | 0.7 | 2.25 | 0.596 | 4.93 | 630 |

The introduction of 2.03 mol. % of Fe$_2$O$_3$ enables the production of a material possessing lower dielectric losses in weak and strong fields at increased values of dielectric and piezoelectric parameters (Table 8).

The piezoceramic material of the present invention is prepared in the following manner.

The starting materials are employed in the form of oxides, carbonates and hydroxides of metals, for example:

PbCO$_3$
TiO$_2$
ZrO$_2$
Nb$_2$O$_5$
WO$_3$
Mg(OH)$_2$
ZnO
MnCO$_3$
MnO$_2$
Co(OH)$_2$
Fe$_2$O$_3$

The starting components of a particular composition are mixed in ball mills according to a "wet process" for a period of 10 hours, whereafter the material is synthesized twice. The synthesis is performed according to conventional ceramic technology in a protective atmosphere of PbO. The synthesis conditions are as follows: a temperature ranging from 750° to 850° C.; the duration of the first synthesis is 4 hours, the second synthesis lasts for 10 hours.

In order to obtain a high quality piezoceramic, the synthesized material is sintered using the hot-pressing method. The pressing conditions are as follows: temperature within the range of from 1,100° to 1,250° C., pressure of 200 kg/cm$^2$, and residence time of 40 min.

After the sintering step, the samples are ground.

In order to perform the polarization necessary to impart the piezoelectric properties to the ceramics, and to measure the electrophysical parameters, it is required that the samples be provided with electrodes. To this end, the samples are coated with a layer of silver paste and maintained at a temperature of 800° C.

The polarization is performed in a silicon oil comprising an organo-silicon liquid at a temperature of from 90° to 185° C. for 25 to 45 minutes in a field of 16.0 to 50 kv/cm intensity.

The samples are tested 24 hours after the polarization process.

DETAILED DESCRIPTION OF PREFERRED EMBODIMENTS

For better understanding of the present invention the following examples illustrating the production of the piezoceramic material according to the present invention are given hereinbelow.

EXAMPLE 1

A piezoceramic material was prepared containing, in mol. %: PbTiO$_3$–42.5; PbNb$_{2/3}$Zn$_{1/3}$O$_3$—4.3; PbZrO$_3$—40.7; PbNb$_{2/3}$Mg$_{1/3}$O$_3$—12.5.

The starting materials for the above compositions were employed in the form of oxides, carbonates, and hydroxides of the metals: PbCO$_3$, TiO$_2$, ZrO$_2$, Nb$_2$O$_5$, ZnO, Mg(OH)$_2$, and mixed in ball mills by a "wet process" for 10 hours. Then, the synthesis of the material was performed twice. The synthesis was effected according to a conventional ceramic technology in a protective PbO atmosphere. The synthesis conditions were as follows: temperature of 850° C., the duration of the first synthesis was 4 hours, the second synthesis duration was 10 hours. The material thus synthesized was subjected to sintering by the hot-pressing method. The hot-pressing conditions were as follows: temperature of 1,200° C., pressure of 200 kg/cm$^2$, and a residence time of 40 minutes. The polarization was performed in silicon oil at a temperature of 100° C. for 30 minutes in a field of 25.0 kV/cm intensity.

The resulting material of the above-mentioned composition had the following electrical characteristics:

$\epsilon^T_{33}$=2,260; d$_{31}$6.6×10$^{-6}$ units CGSE; K$_p$=0.67;

TABLE 8

| System No. | Composition, mol. % | | | | Modifying agent | Electrophysical parameters | | | | | |
|---|---|---|---|---|---|---|---|---|---|---|---|
| | | | | | | | tgδ, % | | | $d_{31} \cdot 10^6$, | |
| | PbTiO$_3$ | PbZrO$_3$ | PbB$^{I}_{1-a}$B$^{II}_{a}$O$_3$ | PbB$^{III}_{1-a}$B$^{IV}_{a}$O$_3$ | | $\epsilon^T_{33}$ | in weak field | $E = 2 \frac{kv}{cm}$ | $K_p$ | CGSE units | Q |
| 2 | 38.8 | 40.1 | PbNb⅔Zn⅓O$_3$ 18.2 | PbNb⅔Co⅓O$_3$ 3.0 | — | 1,560 | 1.58 | 11.8 | 0.6 | 4.36 | 100 |
| " | " | " | " | " | Fe$_2$O$_3$ 2.03 | 2,290 | 0.66 | 8.9 | 0.646 | 5.9 | 130 |
| " | 40.0 | 39.3 | PbNb⅔Zn⅓O$_3$ 17.8 | PbNb⅔Co⅓O$_3$ 2.95 | — | 1,830 | 0.8 | 21.7 | 0.523 | 4.15 | 160 |
| " | " | " | " | " | Fe$_2$O$_3$ 2.03 | 1,920 | 0.48 | 6.4 | 0.576 | 4.59 | 180 | tgδ (in weak field) =1.5%.

EXAMPLE 2

Under conditions similar to those of Example 1, a piezoceramic material was prepared containing, in molar percent: $PbTiO_3$—32.5; $PbNb_{2/3}Zn_{1/3}O_3$—15.45; $PbZrO_3$—32.4; $PbNb_{2/3}Mg_{1/3}O_3$—19.65, and having the following characteristics: $\epsilon^T_{33}=2,500$; $d_{31}=5.97\times10^{-6}$ CGSE units; $K_p=0.6$; tg δ (in weak field)=1.6%; Q=83.

EXAMPLE 3

A piezoceramic material was prepared containing, in molar percent: $PbTiO_3$—40.0; $PbNb_{2/3}Zn_{1/3}O_3$—5.0; $PbZrO_3$—48.6; $PbNb_{2/3}Mg_{1/3}O_3$—6.4; and incorporating, as a modifying agent, 3.7 mol. % of $MnO_2$.

The starting components were taken in the following form: $PbCO_3$, $TiO_2$, $ZrO_2$, $Nb_2O_5$, ZnO, $Mg(OH)_2$, $MnO_2$.

These components employed according to the above composition were mixed in ball mills by a "wet process" for 10 hours. Then, the material was synthesized twice. This synthesis was effected according to conventional ceramic technology in a protective PbO atmosphere. The synthesis conditions were as follows: temperature of 850° C., the first synthesis duration was 4 hours and the second synthesis duration was 10 hours. The sintering is performed by hot-pressing according to the following scheme: temperature 1,200° C., pressure of 200 kg/cm², residence time of 40 minutes. The polarization of samples was effected in silicon oil at a temperature of 100° C. for 30 minutes in a field of 30 kV/cm intensity. The resulting composition had the following electrophysical parameters: $\epsilon^T_{33}=405$; $d_{31}=1.52\times10^{-6}$ CGSE units, $K_p=0.478$; Q=2,185; tg ε (in weak field)=0.3%; at E=2 kV/cm tg ε=1.6%.

EXAMPLE 4

Under conditions similar to those of Example 3 a piezoceramic material was prepared containing, in molar percent: $PbTiO_3$—42.5; $PbNb_{\frac{2}{3}}Zn_{\frac{1}{3}}O_3$—4.3; $PbZrO_3$—40.7; $PbNb_{\frac{2}{3}}Mg_{\frac{1}{3}}O_3$—12.5; and incorporating, as a modifying oxide, 0.83 mol% of CoO. $Co(OH)_2$ was introduced as an additive in the stage of mixing all the starting components.

The electrophysical parameters of the material were as follows: $\epsilon^T_{33}=2,240$; $d_{31}=6.75\times10^{-6}$ CGSE units; $K_p=0.69$; tgδ (in weak field)=0.5%; at E=2 kV/cm tgδ=9.2%; Q=222. The following Examples from 5 to 75 are summarized in Table 9, wherein are shown the proportions of basic components, the concentration of the modifying agents incorporated, the conditions of synthesis, sintering, polarization an the values of the electrophysical parameters.

TABLE 9

| Example No. 1 | Composition mol. % PbTiO₃ 2 | PbZrO₃ 3 | PbB⅓ⁱB⅔ⁱⁱO₃ 4 | PbB½ⁱⁱⁱB½ⁱᵛO₃ 5 | Modifying agent 6 | Synthesis T°C, t, hours 7 | Sintering T°C, t, min kg/cm² 8 | Polarization T°C, t min, E kV/cm 9 | $\varepsilon^T_{33}$ 10 | tgδ, % in weak field 11 | tgδ, % at E= 2kV/cm 12 | Kp 13 | $d_{31}\cdot 10^6$ un.CGSE 14 | Q 15 |
|---|---|---|---|---|---|---|---|---|---|---|---|---|---|---|
| 5 | 42.5 | 37.8 | PBNB⅓Zn⅓O₃ 13.3 | PBNB⅓Co⅓O₃ 8.4 | — | 850 4+10 | 1200 200 | 100 30 30 | 1,740 | 0.9 | — | 0.577 | 4.63 | 168 |
| 6 | 37.5 | 36.9 | PBNB⅓Zn⅓O₃ 10.3 | PBNB⅓Co⅓O₃ 15.3 | — | " | " | " | 1,000 | 1.1 | — | 0.537 | 3.07 | 332 |
| 7 | 32.5 | 35.1 | PBNB⅓Zn⅓O₃ 14.1 | PBNB⅓Co⅓O₃ 18.3 | MnO₂ 3.7 | 850 4+10 | 1160 200 | 100 30 | 582 | 0.98 | 1.6 | 0.44 | 1.7 | 2000 |
| 8 | 38.8 | 40.1 | PBNB⅓Zn⅓O₃ 18.2 | PBNB⅓Co⅓O₃ 3.0 | Fe₂O₃ 2.03 | 850 4+10 | 1170 200 | 100 30 40 | 2,290 | 0.66 | 8.9 | 0.646 | 5.9 | 126 |
| 9 | 40.0 | 34.48 | PBNB⅓Mg⅓O₃ 16.8 | PBNB⅓Co⅓O₃ 8.82 | — | 850 | 1,200 200 | 100 25 40 | 1671 | 0.84 | — | 0.67 | 5.22 | 293 |
| 10 | 35.0 | 33.74 | PBNB⅓Mg⅓O₃ 2.61 | PBNB⅓Co⅓O₃ 28.65 | — | " 4+10 | " | " | 1,140 | 2.45 | — | 0.51 | 2.9 | 294 |
| 11 | 35.0 | 38.42 | PBNB⅓Mg⅓O₃ 23.40 | PBNB⅓Co⅓O₃ 3.18 | MnO₂ 3.8 | 850 4+10 | 1160 200 | 90 30 30 | 506 | 0.24 | 0.75 | 0.446 | 1.58 | 1,070 |
| 12 | 45 | 39.54 | PBNB⅓Zn⅓O₃ 5.44 | PBNB⅓Mn⅓O₃ 10.02 | — | 850 4+10 | 1240 200 | 100 25 30.0 | 1,000 | 0.64 | 1.7 | 0.562 | 3.02 | 1,500 |
| 13 | 42.5 | 39.73 | PBNB⅓Zn⅓O₃ 13.29 | PBNB⅓Mn⅓O₃ 4.48 | — | " | " | " | 1,310 | 0.24 | 1.0 | 0.577 | 3.65 | 1,106 |
| 14 | 42.5 | 44.56 | PBNB⅓Co⅓O₃ 4.49 | PBNB⅓Mn⅓O₃ 8.45 | — | 850 4+10 | 1,170 200 | 180 40 35.0 | 1,340 | 0.28 | 1.5 | 0.646 | 4.34 | 1,003 |
| 15 | 42.5 | 33.29 | PBNB⅓Co⅓O₃ 19.72 | PBNB⅓Mn⅓O₃ 4.49 | — | " | " | " | 1,500 | 0.28 | 1.75 | 0.529 | 3.5 | 794 |
| 16 | 35.0 | 28.34 | PBNB⅓Mg⅓O₃ 8.29 | PBNB⅓Ni⅓O₃ 27.3 | — | 850 | 1,190 200 | 140 40 35.0 | 3,739 | 1.8 | — | 0.642 | 7.67 | 67 |
| 17 | 42.5 | 39.16 | PBNB⅓Mg⅓O₃ 9.36 | PBNB⅓Ni⅓O₃ 10.05 | — | " 4+10 | " | " | 3130 | 1.41 | — | 0.677 | 7.8 | 72 |
| 18 | 35.0 | 28.34 | PBNB⅓Mg⅓O₃ 27.3 | PBNB⅓Ni⅓O₃ 1.9 | MnO₂ | 850 4+10 | 1,160 200 | 100 30 40.0 | 1,740 | 0.57 | 1.8 | 0.565 | 4.12 | 475 |
| 19 | 42.5 | 43.82 | PBNB⅓Ni⅓O₃ 9.36 | PBNB⅓Co⅓O₃ 3.62 | — | 850 4+10 | 1,180 200 | 140 25 30.0 | 830 2,699 | 0.78 1.98 | 8.1 | 0.6 0.656 | 3.06 6.44 | 574 248 |
| 20 | 35.0 | 28.34 | PBNB⅓Ni⅓O₃ 10.06 27.3 | PBNB⅓Co⅓O₃ 9.36 | — | " | " | " | | | | | | |
| 21 | 42.5 | 43.82 | PBNB⅓Ni⅓O₃ | PBNB⅓Co⅓O₃ | MnO₂ | 850 | 1,150 | 100 | | | | | | |

TABLE 9-continued

| Example No. 1 | Composition mol. % | | | | | Modifying agent 6 | Synthesis T°C, t, hours 7 | Conditions of Sintering T°C, t, min kg/cm² 8 | Conditions of Polarization T°C, t min, E kV/cm 9 | Electrophysical parameters | | | | | |
|---|---|---|---|---|---|---|---|---|---|---|---|---|---|---|---|
| | PbTiO₃ 2 | PbZrO₃ 3 | PbB⅓ᴵ B⅔ᴵⱽ O₃ 4 | PbB½ᴵᴵᴵ B½ᴵⱽ O₃ 5 | | | | | | $\Sigma_{33}^T$ 10 | tgδ, % in weak field 11 | tgδ, % at E=2kV/cm 12 | Kp 13 | d₃₁·10⁶ un.CGSE 14 | Q 15 |
| 22 | 40.0 | 39.48 | 10.06 PBW⅓Zn⅔O₃ | 3.62 PBNB⅓Zn⅔O₃ | 3.8 | 4 + 10 800 | 200 1,140 | 45 35.0 140 | 454 | 0.57 | 0.95 | 0.425 | 6.42 | 1,030 |
| 23 | 35.0 | 37.05 | 6.66 PBW⅓Zn⅔O₃ 15.09 | 13.86 PBNB⅓Zn⅔O₃ 12.86 | — | 4 + 10 | 200 | 30 30.0 | 2,555 | 1.49 | — | 0.658 | 6.72 | 56 |
| 24 | 37.5 | 35.63 | PBW⅓Zn⅔O₃ | PBNB⅓Zn⅔O₃ | MnO₂ | 800 | 1,150 | '' | 1,465 | 2.27 | — | 0.64 | 4.66 | 71 |
| 25 | 37.5 | 40.0 | 14.51 PBW⅓Zn⅔O₃ | 12.36 PBNB⅓Co⅔O₃ | 1.9 — | 4 + 10 4 + 10 | 200 1,140 | 90 30. 30.0 100 | 1,590 | 0.57 | 1.4 | 0.587 | 4.25 | 510 |
| 26 | 40.0 | 33.18 | 13.73 PBW⅓Zn⅔O₃ 6.66 | 8.77 PBNB⅓Co⅔O₃ 20.16 | | 4 + 10 | 200 1,140 | 25 30.0 100 | 2,239 | 0.96 | — | 0.616 | 2,762 | 759 |
| 27 | '' | '' | '' | '' | MnO₂ 0.77 | 800 4 + 10 | 200 1,145 | 25 30.0 30 | 2,133 | 2.26 | — | 0.64 | 5.53 | 280 |
| 28 | 42.5 | 42.66 | PBW⅓Zn⅔O₃ | PBNB⅓Co⅔O₃ | '' | 800 | 200 | 100 30 | 2,420 | 0.5 | 6.7 | 0.593 | 5.47 | 360 |
| 29 | 40.0 | 39.48 | 6.38 PBW⅓Mg⅔O₃ 6.66 | 8.46 PBNB⅓Zn⅔O₃ 13.86 | — | 4 + 10 800 | 1,145 200 1,160 | 40.0 100 30 | 1,370 | 0.36 | 2.5 | 0.572 | 3.84 | 430 |
| 30 | 37.5 | 41.13 | PBW⅓Mg⅔O₃ 6.94 | PBNB⅓Zn⅔O₃ 14.43 | '' | 4 + 10 | 200 | 40.0 140 30 | 2,762 | 1.35 | — | 0.703 | 7.65 | 67 |
| 31 | 40.0 | 39.48 | PBW⅓Mg⅔O₃ | PBNB⅓Zn⅔O₃ | — | '' | '' 1,130 | 30.0 90 | 827 | 1.95 | — | 0.564 | 2.89 | 114 |
| 32 | 42.5 | 37.37 | 6.66 PBW⅓Mg⅔O₃ 12.88 | 13.86 PBNB⅓Zn⅔O₃ 7.25 | 0.76 — | '' | 200 1,140 | 35 30.0 140 | 2,100 | 0.29 | 2.2 | 0.595 | 4.97 | 390 |
| 33 | 35.0 | 33.15 | PBW⅓MG⅔O₃ 14.02 | PBNB⅓Co⅔O₃ 17.83 | — | '' | 200 | 30 30.0 | 2,973 | 1.04 | '' | 0.618 | 6.23 | 434 |
| 34 | 42.5 | 41.05 | PBW⅓MG⅔O₃ | PBNB⅓Ni⅔O₃ | — | '' | 1,170 | 140 | 1,268 | 1.97 | — | 0.533 | 3.29 | 492 |
| 35 | 37.5 | 35.06 | 6.39 PBW⅓Mg⅔O₃ 16.19 | 10.06 PBNB⅓Ni⅔O₃ 11.25 | — | '' | 200 | 30 2.0 | 1,666 | 1.16 | 2.74 | 0.61 | 4.68 | 200 |
| 36 | 40.0 | 36.6 | PBW⅓Mg⅔O₃ | PBNB⅓Ni⅔O₃ | MnO₂ | '' | 1,140 | 140 | 1,128 | 1.83 | — | 0.568 | 3.45 | 140 |
| 37 | 42.5 | 38.12 | 13.10 PBW⅓Mg⅔O₃ | 10.3 PBNB⅓Mn⅔O₃ | 0.76 | '' | 200 1,200 | 35. 32.0 100 | 2,180 | 0.15 | 7,750 | 0.643 | 5.76 | 230 |
| | | | 4.48 | 14.9 | — | '' | 200 | 30 30.0 | 1,890 | 0.5 | 2.4 | 0.615 | 49.4 | 193 |

TABLE 9-continued

| Example No. 1 | Composition mol. % | | | | Modifying agent 6 | Conditions of | | | Electrophysical parameters | | | | | |
|---|---|---|---|---|---|---|---|---|---|---|---|---|---|---|
| | PbTiO₃ 2 | PbZrO₃ 3 | PbB$^I_{\frac{1}{4}-\alpha}$B$^{IV}_{\alpha}$O₃ 4 | PbB$^{III}_{\frac{1}{4}-\alpha}$B$^{IV}_{\alpha}$O₃ 5 | | Synthesis T°C, t, hours 7 | Sintering T°C, t, min kg/cm² 8 | Polarization T°C, t min, E kV/cm 9 | $\Sigma^T_{33}$ 10 | tgδ, % | | Kp 13 | d₃₁·10⁶ un.CGSE 14 | Q 15 |
| | | | | | | | | | | in weak field 11 | at E= 2kV/cm 12 | | | |
| 38 | 45.0 | 36.46 | PBW$_\frac{1}{2}$Mg$_\frac{1}{2}$O₃ 4.29 | PBNB$_\frac{2}{3}$Mn$_\frac{1}{3}$O₃ 14.25 | — | " | " | " | 1,885 | 0.6 | 1.6 | 0.54 | 4.04 | 510 |
| 39 | 40.0 | 37.8 | PBW$_\frac{1}{2}$Mg$_\frac{1}{2}$O₃ 6.66 | PBW$_\frac{1}{2}$Zn$_\frac{1}{2}$O₃ 15.54 | — | " | 1,100 200 | 140 30 30.0 | 2,634 | 1.54 | — | 0.675 | 7.06 | 88 |
| 40 | 37.5 | 39.37 | PBW$_\frac{1}{2}$Mg$_\frac{1}{2}$O₃ 6.94 | PBW$_\frac{1}{2}$Zn$_\frac{1}{2}$O₃ 16.19 | — | " | " | " | 989 | 1.76 | — | 0.565 | 3.18 | 107 |
| 41 | 40.0 | 41.46 | PBW$_\frac{1}{2}$Ni$_\frac{1}{2}$O₃ 4.68 | PBNB$_\frac{2}{3}$Zn$_\frac{1}{3}$O₃ 13.86 | — | 800 4+10 | 1,140 200 | 140 30 30.0 | 1,470 | 1.86 | — | 0.615 | 4.76 | 205 |
| 42 | 42.5 | 39.73 | PBW$_\frac{1}{2}$Ni$_\frac{1}{2}$O₃ 4.48 | PBNB$_\frac{2}{3}$Zn$_\frac{1}{3}$O₃ 13.29 | — | " | " | " | 2,480 | 1.2 | — | 0.613 | 5.92 | 83 |
| 43 | 42.5 | 39.73 | PBW$_\frac{1}{2}$Ni$_\frac{1}{2}$O₃ 4.48 | PBNB$_\frac{2}{3}$Zn$_\frac{1}{3}$O₃ 13.29 | MnO₂ 0.76 | " | 1,145 200 | 90 40 32.0 | 2,280 | 0.42 | 4.1 | 0.65 | 5.91 | 75 |
| 44 | 37.5 | 31.25 | PBNB$_\frac{2}{3}$Mg$_\frac{1}{3}$O₃ 18.75 | PBW$_\frac{1}{2}$Ni$_\frac{1}{2}$O₃ 12.5 | — | 850 4+10 | 1,100 200 | 100 30 35.0 | 3,468 | 2.65 | — | 0.668 | 7.88 | 63 |
| 45 | 40.0 | 30.0 | PBW$_\frac{1}{2}$Ni$_\frac{1}{2}$O₃ 12.0 | PBNB$_\frac{2}{3}$Mg$_\frac{1}{3}$O₃ 18.0 | — | " | " | " | 4,197 | 1.6 | — | 0.633 | 7.96 | 78 |
| 46 | 42.5 | 40.14 | PBW$_\frac{1}{2}$Ni$_\frac{1}{2}$O₃ 10.46 | PBNB$_\frac{2}{3}$Mg$_\frac{1}{3}$O₃ 6.9 | MnO₂ 1.9 | 800 4+10 | 1,130 200 | 90 30 30.0 | 1,890 | 0.62 | 2.5 | 0.602 | 4.88 | 0 |
| 47 | 37.5 | 40.13 | PBW$_\frac{1}{2}$Ni$_\frac{1}{2}$O₃ 4.88 | PBNB$_\frac{2}{3}$Mg$_\frac{1}{3}$O₃ 17.49 | MnO₂ 3.8 | " | " | " | 550 | 0.42 | 1.6 | 0.484 | 1.82 | 950 |
| 48 | 40.0 | 36.6 | PBW$_\frac{1}{2}$Ni$_\frac{1}{2}$O₃ 11.94 | PBNB$_\frac{2}{3}$Co$_\frac{1}{3}$O₃ 11.46 | — | " | 1,470 200 | 140 35 35.0 | 3,009 | 1.48 | — | 0.637 | 6.73 | 89 |
| 49 | 42.5 | 40.54 | PBNB$_\frac{2}{3}$Ni$_\frac{1}{3}$O₃ 12.48 | PBNB$_\frac{2}{3}$Mn$_\frac{1}{3}$O₃ 4.48 | — | 800 4+10 | 1,170 200 | 140 35 30.0 | 2,270 | 0.34 | 3.1 | 0.639 | 5.65 | 679 |
| 50 | 40.0 | 43.50 | PBNB$_\frac{2}{3}$Ni$_\frac{1}{3}$O₃ 5.58 | PBNB$_\frac{2}{3}$Mn$_\frac{1}{3}$O₃ 10.92 | — | " | " | " | 501 | 0.56 | 1.4 | 0.518 | 1.86 | 1725 |
| 51 | 37.5 | 30.44 | PBNB$_\frac{2}{3}$Ni$_\frac{1}{3}$O₃ 26.25 | PBW$_\frac{1}{2}$Ni$_\frac{1}{2}$O₃ 5.81 | — | " | " | " | 2,360 | 1.9 | — | 0.655 | 6.14 | 66 |
| 52 | 42.5 | 34.67 | PBNB$_\frac{2}{3}$Ni$_\frac{1}{3}$O₃ 10.35 | PBNB$_\frac{2}{3}$Ni$_\frac{1}{3}$O₃ 12.48 | — | " | " | " | 2,142 | 1.38 | — | 0.652 | 5.86 | 93 |
| 53 | 37.5 | 30.44 | PBNB$_\frac{2}{3}$Ni$_\frac{1}{3}$O₃ 26.25 | PBNB$_\frac{2}{3}$Ni$_\frac{1}{3}$O₃ 5.81 | MnO₂ 1.9 | " | 1,140 200 | 90 45 30.0 | 1,520 | 0.45 | 2.35 | 0.525 | 3.54 | 770 |
| 54 | 42.5 | 37.26 | PBW$_\frac{1}{2}$Mg$_\frac{1}{2}$O₃ 14.9 | PBW$_\frac{1}{2}$Ni$_\frac{1}{2}$O₃ 5.34 | — | " | 1,120 200 | 80 40 35.0 | 2,310 | 0.72 | — | 0.584 | 5.01 | 172 |
| 55 | 37.5 | 40.5 | PBW$_\frac{1}{2}$Mg$_\frac{1}{2}$O₃ | PBW$_\frac{1}{2}$Ni$_\frac{1}{2}$O₃ | — | " | " | " | 1,120 | 1.55 | — | 0.5 | 2.94 | 188 |

TABLE 9-continued

| Example No. 1 | Composition mol. % | | | | | Modifying agent 6 | Synthesis T°C, t, hours 7 | Conditions of Sintering T°C, t, kg/cm² 8 | Conditions of Polarization T°C., t, min, E min, E kV/cm 9 | Electrophysical parameters | | | | | |
|---|---|---|---|---|---|---|---|---|---|---|---|---|---|---|---|
| | PbTiO₃ 2 | PbZrO₃ 3 | PbB⁴₄₋ₐBₐ'O₃ 4 | PbB⁴₄₋ₐBₐ'''O₃ 5 | | | | | | $\Sigma_{33}^T$ 10 | tgδ, % in weak field 11 | at E= 2kV/cm 12 | Kp 13 | $d_{31} \cdot 10^6$ un.CGSE 14 | Q 15 |
| 56 | 37.5 | 35.0 | 16.18 PBW₁Co₂O₃ 9.62 | 5.82 PBNB⅔Co⅓O₃ 17.88 | — | " | 1,135 " 200 | 80 25 20.0 | 3,368 | 5.03 | — | 0.622 | 6.65 | 198 |
| 57 | 40.0 | 35.34 | PBW₁Co₂O₃ 4.5 | PBNB⅔Co⅓O₃ 20.16 | — | " | " | " | 2,548 | 0.69 | — | 0.608 | 5.61 | 147 |
| 58 | 42.5 | 38.29 | PBW₁Mg₂O₃ 14.89 | PBW₁Co₂O₃ 4.32 | — | " | 1,150 " 200 | 80 25 30.0 | 2,390 | 2.09 | — | 0.605 | 5.42 | 250 |
| 59 | 42.5 | 40.71 | PBW₁Ni₂O₃ 4.31 | PBW₁Co₂O₃ 12.48 | — | " | " | 90 25 30.0 | 2,387 | 1.4 | — | 0.633 | 5.84 | 232 |
| 60 | 45.0 | 38.94 | PBW₁Ni₂O₃ 4.12 | PBW₁Co₂O₃ 11.94 | — | " | " | " | 1,986 | 1.17 | — | 0.504 | 3.96 | 3.66 |
| 61 | 45.0 | 35.31 | PBW₁Ni₂O₃ 14.25 | PBNB⅔Mg⅓O₃ 5.44 | — | " | 1,150 " 200 | 120 30 30.0 | 1,423 | 0.25 | — | 0.519 | 3.44 | 538 |
| 62 | 40.0 | 38.4 | PBW₁Co₂O₃ 13.13 | PBNB⅔Zn⅓O₃ 8.42 | — | " | 1,140 " 200 | 90 25 30.0 | 1,435 | 1.05 | — | 0.623 | 4.34 | 424 |
| 63 | 37.5 | 42.37 | PBW₁Co₂O₃ 16.19 | PBNB⅔Zn⅓O₃ 3.94 | — | " | " | " | 1,032 | 0.46 | — | 0.614 | 3.6 | 307 |
| 64 | 40.0 | 41.46 | PBW₁Zn₂O₃ 4.68 | PBNB⅔Ni⅓O₃ 13.86 | — | " | " | 100 30 35.0 | 1,470 | 1.86 | — | 0.615 | 4.76 | 205 |
| 65 | 37.5 | 44.94 | PBW₂Zn₂O₃ 11.38 | PBNB⅔Ni⅓O₃ 6.18 | — | " | " | " | 1,072 | 1.76 | — | 0.566 | 3.28 | 142 |
| 66 | 40.0 | 36.6 | PBNB⅔Ni⅓O₃ 11.46 | PBW₁Co₂O₃ 11.94 | — | " | " | " | 3,009 | 1.48 | — | 0.637 | 6.73 | 89 |
| 67 | 42.5 | 42.66 | PBW₁Co₂O₃ | PBNB⅔Mg⅓O₃ | — | " | 1,170 " 200 1,140 200 | 140 35 35.0 100 30.0 | 1,633 | 1.89 | — | 0.55 | 4.72 | 266 |
| 68 | 40.0 | 39.0 | PBW₁Co₂O₃ 13.44 | PBNB⅔Mg⅓O₃ 7.56 | — | " | " | " | 750 | 0.62 | — | 0.555 | 2.59 | 605 |
| 69 | 42.5 | 37.26 | PBW₁Ni₂O₃ 5.34 | PBW₁Zn₂O₃ 14.9 | — | " | " | " | 2,376 | 1.28 | — | 0.533 | 4.76 | 90 |
| 70 | 42.5 | 38.52 | PBW₁Co₂O₃ | PBNB⅔Mn⅓O₃ 9.88 | — | " | 1,170 " 200 | 140 35 35.0 | 1,650 | 0.84 | 2.3 | 0.512 | 3.53 | 1.065 |
| 71 | 40.0 | 42.42 | PBW₁Zn₂O₃ 6.66 | PBNB⅔Mn⅓O₃ 10.92 | — | " | " | " | 555 | 0.62 | 1.75 | 0.507 | 2.0 | 1.292 |
| 72 | 40.0 | 39.96 | PBW₂Zn₂O₃ 15.54 | PBW₂Co~O₃ 4.5 | — | " | 1,180 " 200 | 140 30 35.0 | 2,376 | 0.59 | — | 0.567 | 4.99 | 320 |
| 73 | 42.5 | 38.29 | PBW₁Zn₂O₃ 14.9 | PBW₁Co₂O₃ 4.31 | — | " | " | " | 792 | 1.04 | — | 0.56 | 2.78 | 569 |

TABLE 9-continued

| Example No. | Composition mol. % | | | | | Modifying agent | Synthesis T°C, t, hours | Conditions of Sintering T°C, t, min kg/cm² | Conditions of Polarization T°C, t, min, E kV/cm | Electrophysical parameters | | | | |
|---|---|---|---|---|---|---|---|---|---|---|---|---|---|---|
| | $PbTiO_3$ | $PbZrO_3$ | $PbB'_{1-\alpha}B''_\alpha O_3$ | $PbB'_{1-\alpha}B''_\alpha O_3$ | $PbB'''_{1-\alpha}B^{IV}_\alpha O_3$ | | | | | $\Sigma^T_{33}$ | $tg\delta$, % in weak field | $tg\delta$, % at E= 2kV/cm | $K_p$ | $d_{31} \cdot 10^6$ un.CGSE | Q |
| 1 | 2 | 3 | 4 | | 5 | 6 | 7 | 8 | 9 | 10 | 11 | 12 | 13 | 14 | 15 |
| 74 | 40.0 | 35.82 | $PBW_{\frac{1}{2}}Ni_{\frac{1}{2}}O_3$ 15.54 | | $PBNB_{\frac{2}{3}}Mg_{\frac{1}{3}}O_3$ 8.64 | — | " | " | 1,269 2.38 | | | — | 0.562 | 5.1 | 112 |
| 75 | 42.5 | 34.33 | $PBW_{\frac{1}{2}}Ni_{\frac{1}{2}}O$ hd 3 14.89 | | $PBNB_{\frac{2}{3}}Mg_{\frac{1}{3}}O_3$ 8.28 | — | " | " | 2,805 1.58 | | | 0.51 | 3.58 | | 100 |

Note:
(4+10 hours) - duration of synthesis: first - 4 hours; second - 10 hours.

What is claimed is:

1. A piezoceramic material consisting essentially of, in molar percent:
 $PbTiO_3$—40
 $PbZrO_3$—35.40
 $PbW_{\frac{1}{2}}Ni_{\frac{1}{2}}O_3$—9.84
 $PbNb_{\frac{2}{3}}Mg_{\frac{1}{3}}O_3$—14.76.

2. A piezoceramic material consisting essentially of, in molar percent:
 $PbTiO_3$—38.75
 $PbZrO_3$—30.62
 $PbW_{\frac{1}{2}}Ni_{\frac{1}{2}}O_3$—12.25
 $PbNb_{\frac{2}{3}}Mg_{\frac{1}{3}}O_3$—18.37.

3. The piezoceramic material as claimed in claim 2, containing, as a modifying oxide, 0.76 mol.% of $MnO_2$.

4. A piezoceramic material consisting essentially of, in molar percent:
 $PbTiO_3$—37.5
 $PbZrO_3$—31.25
 $PbW_{\frac{1}{2}}Ni_{\frac{1}{2}}O_3$—12.5
 $PbNb_{\frac{2}{3}}Mg_{\frac{1}{3}}O_3$—18.75.

5. A piezoceramic material consisting essentially of, in molar percent:
 $PbTiO_3$—40.0
 $PbZrO_3$—30.0
 $PbW_{\frac{1}{2}}Ni_{\frac{1}{2}}O_3$—12.0
 $PbNb_{\frac{2}{3}}Mg_{\frac{1}{3}}O_3$—18.0.

* * * * *